(12) United States Patent
Joyce

(10) Patent No.: US 7,277,467 B2
(45) Date of Patent: Oct. 2, 2007

(54) EXTERNALLY ALIGNED LASER MODULE

(75) Inventor: William B. Joyce, Basking Ridge, NJ (US)

(73) Assignee: TriQuint Technology Holding Co., Hillsboro, OR (US)

( * ) Notice: Subject to any disclaimer, the term of this patent is extended or adjusted under 35 U.S.C. 154(b) by 281 days.

(21) Appl. No.: 09/998,962

(22) Filed: Oct. 31, 2001

(65) Prior Publication Data

US 2003/0081640 A1    May 1, 2003

(51) Int. Cl.
*H01S 3/08*    (2006.01)
(52) U.S. Cl. ..................... 372/107; 356/153
(58) Field of Classification Search ............. 372/36, 372/107, 108; 356/153
See application file for complete search history.

(56) References Cited

U.S. PATENT DOCUMENTS

| | | | |
|---|---|---|---|
| 5,074,682 A * | 12/1991 | Uno et al. ................ 385/93 |
| 5,381,499 A * | 1/1995 | Takenaka et al. .......... 385/93 |
| 5,812,258 A * | 9/1998 | Pierson .................... 356/153 |
| 6,244,755 B1 | 6/2001 | Joyce et al. ............... 385/90 |
| 6,247,852 B1 | 6/2001 | Joyce ....................... 385/90 |

* cited by examiner

*Primary Examiner*—Minsun Oh Harvey
*Assistant Examiner*—Tuan N. Nguyen
(74) *Attorney, Agent, or Firm*—Lester H. Birnbaum

(57) ABSTRACT

Disclosed is a laser module case having a snout disposed within a wall of the case, wherein the snout may allow alignment of a laser with an optical fiber after closure of the case. The snout has an inner end, outer end and longitudinal hollow. An optical fiber assembly, also with an inner end, outer end and longitudinal hollow, is disposed within the snout hollow. An inner flange secures the snout to the optical fiber assembly at their inner ends and an outer flange secures the snout to the optical fiber assembly at their outer ends. The optical fiber assembly is of a smaller cross-sectional diameter than the snout hollow so that it may move in an X and Y-direction. The optical fiber assembly may be aligned with a laser positioned within the case after the case is closed. The aligned fiber assembly may then be secured in position by the outer flange.

14 Claims, 2 Drawing Sheets

EXTERNALLY ALIGNED LASER MODULE

FIELD OF THE INVENTION

The invention relates to semiconductor lasers, and more particularly to mounting of lasers within a module.

BACKGROUND OF THE INVENTION

A laser module includes a laser device surrounded by a protective case. A cross-sectional view of a typical module design is depicted in FIG. 1. The laser 102 is positioned on a platform 104 within a case 106. A stack 116 may be present to position laser 102 at the height of an optical fiber 110. Stack 116 may include one or more parts. A clip 108 is situated on platform 104 in close proximity to laser 102. Clip 108 supports optical fiber 110 which is aligned with laser 102. Clip 108 is designed to allow alignment in the X, Y and Z-directions, where the Z-direction is the direction of light propagation. The optical fiber is typically surrounded by a sleeve 114. Optical fiber 110 extends outside of a case wall 112 through snout 118. Proper alignment of optical fiber 110 with laser 102 is important for the performance of the device.

Typically the optical fiber is aligned with the laser prior to enclosure in the case. Subsequent testing, such as thermal cycling and baking, use and environmental conditions before and after case enclosure may cause misalignment. The case enclosure process may also cause misalignment. Furthermore, attachment of the module to other components, such as a support plate, may cause stresses that affect alignment.

Accordingly, there is a need for a laser module that will allow alignment after case enclosure.

SUMMARY OF THE INVENTION

Embodiments of the invention provide a laser module case in which alignment of a laser and optical fiber assembly may be adjusted after the laser module case is closed. In an illustrative embodiment, the post-closure alignment capabilities are realized by eliminating the clip from the laser module design. Alignment capabilities are provided by a snout design which allows adjustment of the optical fiber assembly after the module case is in place.

In an illustrative embodiment of the invention, the laser module case has a snout disposed within a wall of the case. The snout has an inner end, outer end and longitudinal hollow. An optical fiber assembly, also with an inner end and outer end, is disposed within the snout hollow. An inner flange secures the snout to the optical fiber assembly at their inner ends, and an outer flange may secure the snout to the optical fiber assembly at their outer ends. The optical fiber assembly is of a smaller cross-sectional diameter than the snout hollow so that it may move in an X and Y-direction, wherein the X-Y plane is other than parallel with the longitudinal direction of the optical fiber assembly. In an exemplary embodiment, the X-Y plane is substantially perpendicular to the longitudinal direction of the optical fiber assembly.

The optical fiber assembly may be aligned with a laser positioned within the case after the case is closed. The aligned fiber assembly may then be secured in position by the outer flange.

DESCRIPTION OF THE DRAWINGS

The invention is best understood from the following detailed description when read with the accompanying drawings.

DETAILED DESCRIPTION OF THE INVENTION

Embodiments of the invention comprise laser modules, wherein alignment of the laser with an optical fiber assembly may be performed after the laser is enclosed in a case. In an illustrative embodiment of the invention, the case is deformable so that an optical fiber assembly disposed through a wall in the case may be aligned with a laser within the case by deformation of the case.

Figure 1:
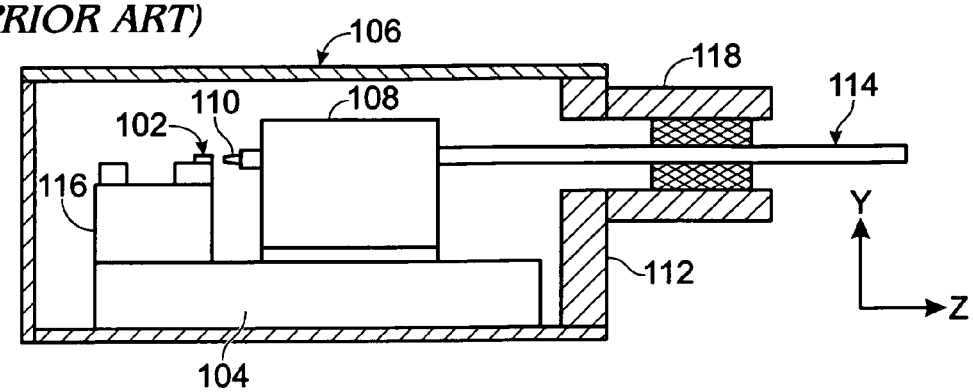
FIG. 1 depicts a cross-sectional view of a prior art laser module.
Figure 2:
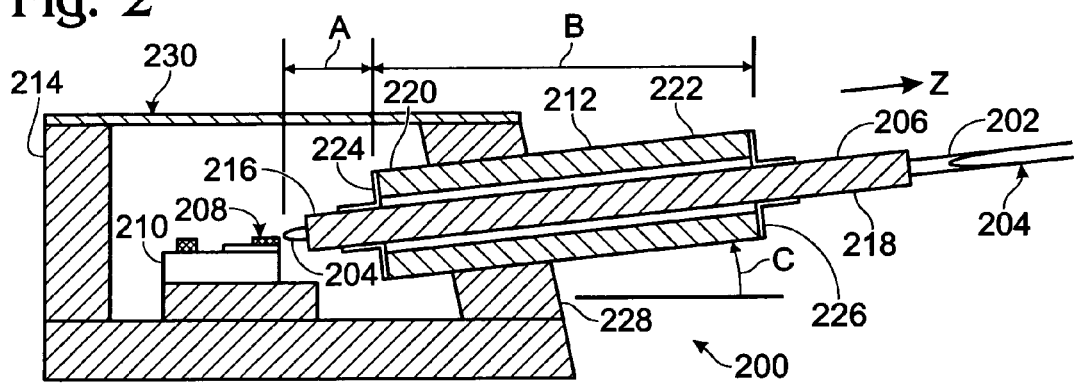
FIG. 2 depicts a cross-sectional view of a laser module case according to a first illustrative embodiment of the invention.

FIG. 2 depicts a cross-sectional view of a laser module 200 according to a further illustrative embodiment of the invention. Laser module 200 includes an optical fiber assembly 202, which may have for example, an optical fiber 204 disposed within a sleeve 206. Optical fiber 204 is to be aligned with a laser 208. Laser 208 is shown on a plurality of components or laser stack 210 which provide support and positioning of laser 208. Optical fiber assembly 202 is disposed within snout 212 which penetrates case 214. Optical fiber assembly 202 has an inner end 216 and an outer end 218. Snout 212 also has an inner end 220 and an outer end 222. The optical fiber assembly's inner end 216 is secured to the snout's inner end 220. FIG. 2 shows inner ends 216 and 220 being secured by a flange 224, however, any other securing device or material may be used that is compatible with the device operation and materials. Illustrative examples of other securing devices include welded, glued and soldered joints. Flange 226 secures snout outer end 222 to optical fiber assembly outer end 218. Inner and outer securing devices may be bendable, however, it is preferable to have one flange stiff with respect to translation in the Z-direction. This stiffness insures that any pull on fiber 204 external to the case does not materially affect the Z-separation between fiber 204 and laser 208. If the materials and/or affixing processes are such that there could arise a Z-direction stress between the two flanges, the other flange can be made thinner to flex more readily in the Z-direction in a diaphragm action, and immediately relieve any such Z-stress. Otherwise this Z-stress might relieve over time and cause creep of alignment over useful life. With this stress-relief scheme it becomes possible to use different materials for sleeve 206, than for the rest of case 214. Freedom to choose materials for other objectives of manufacture is of great value.

It is not necessary to have the Z-stiff flange be one nearer to the laser. It can be either flange. The Z-tolerance of alignment (typically 2 μm, plus or minus a factor of three)

is typically five to ten times larger than the Y-tolerance and is large enough to accommodate the change in laser-to-fiber distance from typical stress relief if the more remote flange is the stiff one.

Both flanges are preferably stiff in the X and Y-directions. Thus either a stiff or a Z-bendable flange may be used for either the coarse or fine alignment in the X and Y-directions.

The stiff flange can also be used to fine tune the Z-alignment. Thus, if the stiff flange is external to case 214, it permits external alignment in the Z-direction, as well as in X and Y-directions. In an exemplary process, the fine tuning of the Z-alignment is done by pulling or pushing sleeve 206 in the Z-direction before affixing the flange to sleeve 206. This could be before, during, or after X and Y-alignment and set by affixing the same external flange to snout 212.

It is desirable to have approximate rotational symmetry of the flanges about the Z-axis so that a Z-motion of the fiber is not accompanied by an X or Y-motion. In a further embodiment of the invention, the symmetry of the flange or other sleeve-holding device is broken so that, for example, the Y-alignment of the fiber to laser is done in whole or part by sliding the sleeve in the Z-direction to obtain the desired Y-alignment.

Figure 5:
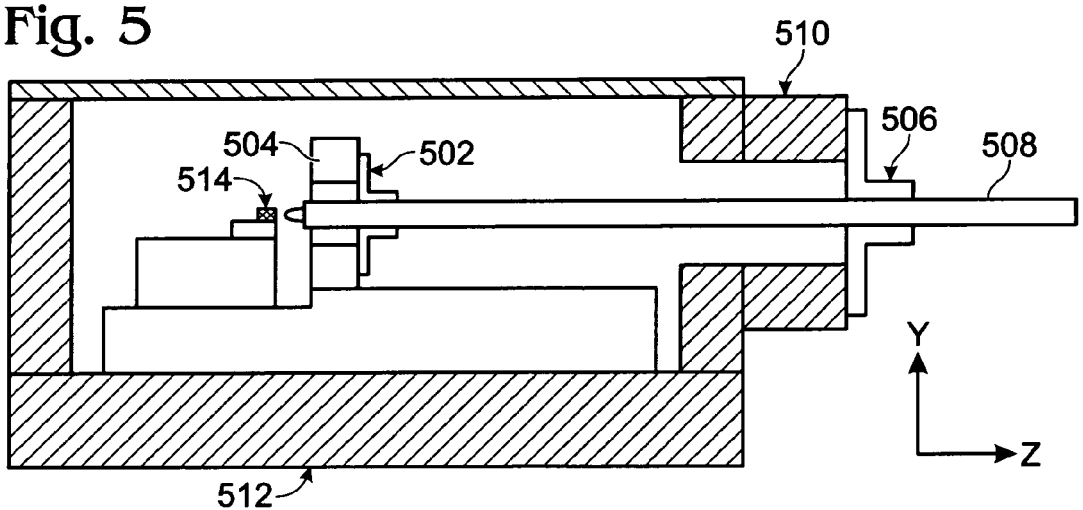
FIG. 5 depicts a cross-sectional view of a laser module according to a third embodiment of the invention.

FIG. 5 depicts a further illustrative embodiment of the invention. A first flange 502 secures optical fiber assembly 508 to platform extension 504. A second flange 506 secures optical fiber assembly 508 to case snout 510. By providing a bendable first flange 502, optical fiber assembly 508 may be aligned with laser 514 after closure of case 512. If second flange 506 is stiff, alignment may still be possible in the Z-direction. It should be noted that with any embodiments of the invention, whether flanges are stiff or bendable will determine degrees and directions of alignment possible.

Figure 6:
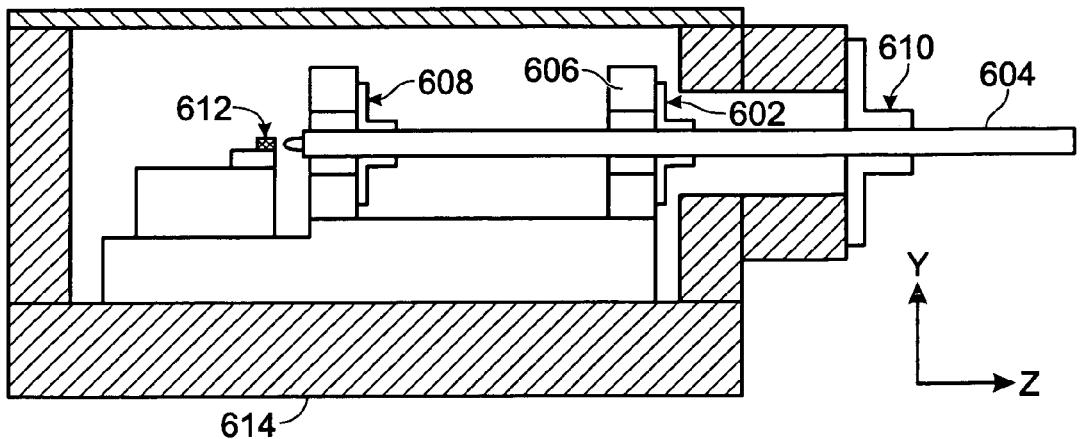
FIG. 6 depicts a cross-sectional view of a laser module according to a fourth embodiment of the invention.

Designs with more than two flanges will also work and will facilitate handling and coarse alignment at the platform level. FIG. 6 depicts yet another illustrative embodiment of the invention. FIG. 6 shows a third flange 602 which secures optical fiber assembly 604 to a second platform extension 606. The laser module of FIG. 6 also has a first flange 608 interior to a case 614, and a second flange 610 exterior to the case. If both flanges 602 and 608 are bendable in the Z-direction, a stiff external flange 610 can also facilitate alignment of a laser 612 with optical fiber assembly 604 in the Z-direction.

Although sleeves of constant diameter are shown in the figures, manufacturing and alignment optimization will often lead to a varying diameter along the length of the sleeve.

Figure 3A:
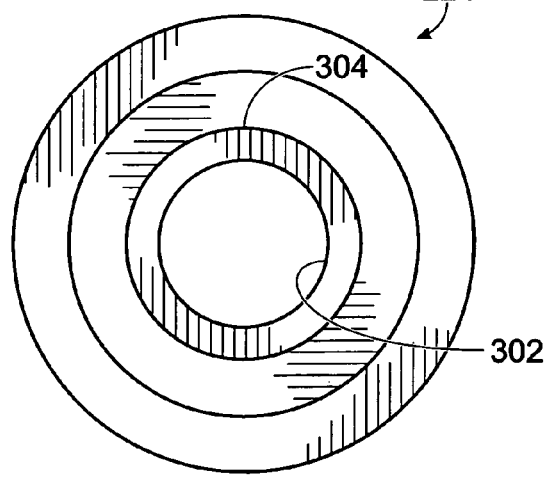
FIGS. 3A–B depict an end view and cross-sectional view, respectively, of an illustrative embodiment of a flange.
Figure 3B:
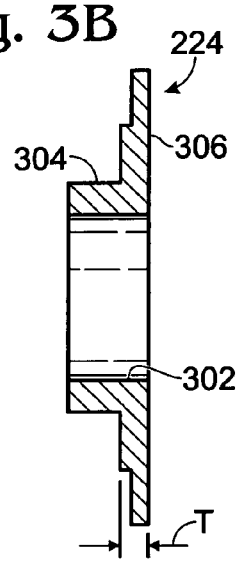

Flange 224 is further depicted in FIGS. 3A–B, which show an end view and cross-sectional view, respectively. In the illustrative embodiment depicted in FIGS. 3A–B, flange 224 has an opening 302 through which optical fiber assembly 202 may pass. A first flange section 304 secures optical fiber assembly 202 to flange 224. A second flange portion 306 secures flange 224 to snout 212. Flange 224 is depicted having two thicknesses in portion 306. Increased thickness may provide added structural support. Flange 224, however, may be any shape that has a first portion 304 to secure flange 224 to optical fiber assembly 202, and a second portion 306 that secures snout 212 to flange 224.

Figure 4:
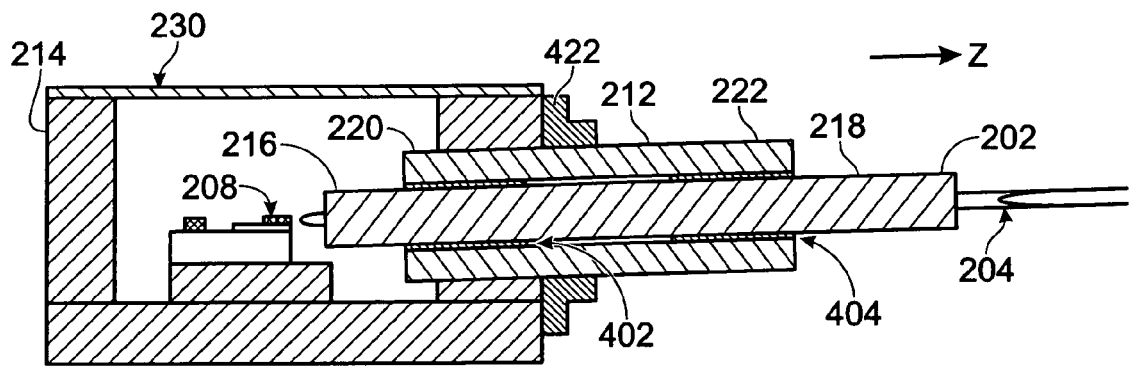
FIG. 4 depicts a cross-sectional view of a laser module case according to a second illustrative embodiment of the invention.

FIG. 4 depicts a cross-sectional view of a laser module case according to a second illustrative embodiment of the invention. In this embodiment, fiber assembly 202 is secured to snout 212 by an inner solder joint 402 toward snout inner end 220 and optical fiber assembly inner end 216. Optical fiber assembly 202 may be secured to snout outer end 222 by an optional solder joint 404. Flange 422 secures snout 212 to case 214. Alignment is effectuated by bending snout 212 relative to case 214. The resulting plastic deformation may occur in snout 212, case 214, flange 422 or a combination thereof.

A lid 230, shown in FIGS. 2 and 4, would typically be secured to case 214 after at least a crude alignment of optical fiber 204 with laser 208. Securing may be accomplished, for example by welding, which in essence renders lid 230 a part of case 214. This initial alignment may be accomplished for example, by welding inner flange 224 to optical fiber assembly 202. A solder joint 402 or the like may also be used for this purpose. Because optical fiber assembly 202 diameter is less than that of snout 212, optical fiber assembly 202 is free to move within snout 212, thereby allowing for adjustment of fiber 204 position. Additionally, or alternatively, snout 212 may be moved in an X, Y, or Z-direction by forcing it to move relative to case 214. This may be done, for example, by applying force to the outer end of snout 212. At least a portion of case 214 must be compliant enough to allow such movement. Alignment may also be effectuated by bending case 214, flanges 224, 226 and/or 442. Flanges 224 and/or 226 may have enough rotational flexibility to act as a pivot point about which optical fiber assembly 202 can rotate. After lid 230 is placed on case 214, an outer flange 226 or other securing method, such as solder joint 404, may be used to position optical fiber assembly 202 in alignment with laser 208.

The X and Y-alignment has a mechanical advantage by the ratio of B/A, wherein dimensions A and B are shown in FIG. 2. Either flange 224 or 226 may be made bendable in the Z-direction. This may be accomplished, for example, by a small T value as diagramed in FIG. 3B. This reduces stress between the two flanges. If inner flange 224 is bendable, outer flange 226 may be used to adjust the Z-direction of the alignment. Preferably, at least one flange is hermetically welded. Normally angle C, shown in FIG. 2, would be approximately zero. In some instances, however, a tilt of optical fiber assembly 202 or of case wall 228 can be used to compensate for a tilted beam angle from off-axis crystal growth.

Advantageously, optical fiber 204 may be aligned to laser 208 after case 214 is closed by lid 224. This is often necessary after module testing, after securing a module to a base plate or when environmental factors have caused misalignment after case 214 is closed.

While the invention has been described by illustrative embodiments, additional advantages and modifications will occur to those skilled in the art. Therefore, the invention in its broader aspects is not limited to specific details shown and described herein. Modifications, for example, to joints securing the optical fiber assembly to the snout, and materials used for the laser module components, may be made without departing from the spirit and scope of the invention. Accordingly, it is intended that the invention not be limited to the specific illustrative embodiments but be interpreted within the full spirit and scope of the appended claims and their equivalence.

The invention claimed is:

1. A laser module case comprising:
  a snout through which an optical fiber assembly may be passed, wherein the optical fiber assembly includes an optical fiber disposed within a sleeve, the snout disposed through a wall of the case, wherein the optical fiber assembly is movable in X, Y and Z-directions within the snout so that the optical fiber may be aligned with a laser within the laser module case after the module case is closed, wherein the snout has an inner end and an outer end; and an inner joint to secure the snout to the optical assembly at the inner end, wherein the optical fiber assembly is of a smaller cross-sectional exterior diameter than the snout cross-sectional inner diameter so that the optical assembly may move in an X and Y-direction within the snout and may thereby be aligned with a laser positioned within the case, and wherein the sleeve able to move in the Z-direction to align the optical fiber assembly in the Z-direction; and an outer joint to secure the snout to the optical assembly at the outer end.

2. The laser module case of claim 1 wherein the optical fiber assembly is of a smaller cross-sectional exterior diameter than the snout cross-sectional inner diameter so that the optical assembly may move in the X and Y-directions within the snout.

3. The laser module case of claim 2 wherein at least a portion of the case comprises a deformable material.

4. The laser module case of claim 1, wherein the aligned optical fiber assembly may be secured in position by the outer joint.

5. The laser module case of claim 1 wherein at least a portion of the outer joint is compliant.

6. The laser module case of claim 4 wherein the outer joint is a flange.

7. The laser module case of claim 4 wherein the outer joint is a solder joint.

8. The laser module case of claim 4 wherein the inner joint is a welded joint.

9. The laser module case of claim 1 wherein at least a portion of the inner joint is compliant.

10. The laser module case of claim 1 wherein the inner joint is a flange.

11. The laser module case of claim 1 wherein the inner joint is a solder joint.

12. The laser module case of claim 1 wherein the inner joint is a welded joint.

13. A laser module case comprising:

a hollow snout having an inner end and an outer end an outer joint; and an inner joint;

wherein the snout is disposed through a wall of the case;

an optical fiber assembly is disposed through the snout, wherein the optical fiber assembly includes an optical fiber disposed within a sleeve;

the inner joint secures the snout to the optical fiber assembly at their inner ends; and the optical fiber assembly is disposed through the snout, wherein the optical fiber assembly includes an optical fiber disposed within a sleeve;

the inner joint secures the snout to the optical fiber assembly at their inner ends; and the optical fiber assembly is of a smaller cross-sectional exterior diameter than the snout cross-sectional inner diameter so that the optical fiber assembly may move in X, Y, and Z-direction within the snout, wherein the sleeve able to move in the Z-direction to align the optical fiber assembly in the Z-direction; and wherein the optical fiber may be aligned with a laser positioned within the case after the case is closed.

14. The laser module case of claim 13 further comprising:

an outer joint to secure the snout to the optical fiber assembly at their outer ends.

* * * * *